United States Patent
Escobar-Bowser et al.

(10) Patent No.: US 6,867,653 B2
(45) Date of Patent: Mar. 15, 2005

(54) APPARATUS AND METHOD FOR CONVERTING A FULLY-DIFFERENTIAL CLASS-AB INPUT SIGNAL TO A RAIL-TO-RAIL SINGLE ENDED OUTPUT SIGNAL

(75) Inventors: Pricilla Escobar-Bowser, Plano, TX (US); Maria-Flora Carreto, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/628,158

(22) Filed: Jul. 28, 2003

(65) Prior Publication Data

US 2005/0024149 A1 Feb. 3, 2005

(51) Int. Cl.[7] .............................. H03F 3/04; H03F 3/45
(52) U.S. Cl. ..................... 330/301; 330/260; 330/258
(58) Field of Search .......................... 330/69, 255, 258, 330/260, 275, 301

(56) References Cited

U.S. PATENT DOCUMENTS

| | | | |
|---|---|---|---|
| 6,163,216 A | * | 12/2000 | Murray et al. .............. 330/255 |
| 6,294,958 B1 | * | 9/2001 | Eschauzier .................. 330/267 |
| 6,542,032 B2 | * | 4/2003 | Escobar-Bowser et al. . 330/255 |
| 6,784,736 B2 | * | 8/2004 | Parkhurst ..................... 330/255 |

* cited by examiner

Primary Examiner—Khanh V. Nguyen
(74) Attorney, Agent, or Firm—W. Daniel Swayze, Jr.; W. James Brady; Frederick J. Telecky, Jr.

(57) ABSTRACT

An apparatus for converting a fully-differential input signal to an output signal which varies between two rail limits and includes: (a) a first buffer receiving one component at a first input, presenting a first buffer output signal at a first buffer output and generating a first representative signal; (b) a second buffer receiving the other component at a second input, presenting a second buffer output signal at a second buffer output and generating a second representative signal; (c) a control unit coupled with at least one of the buffer outputs and comparing the buffer output signals with a reference signal to generate at least one control signal for reducing drift in the first and second components; and (d) an output unit coupled for combining the representative signals from the buffers to present the single output signal with rail-to-rail variance at an output locus.

15 Claims, 6 Drawing Sheets

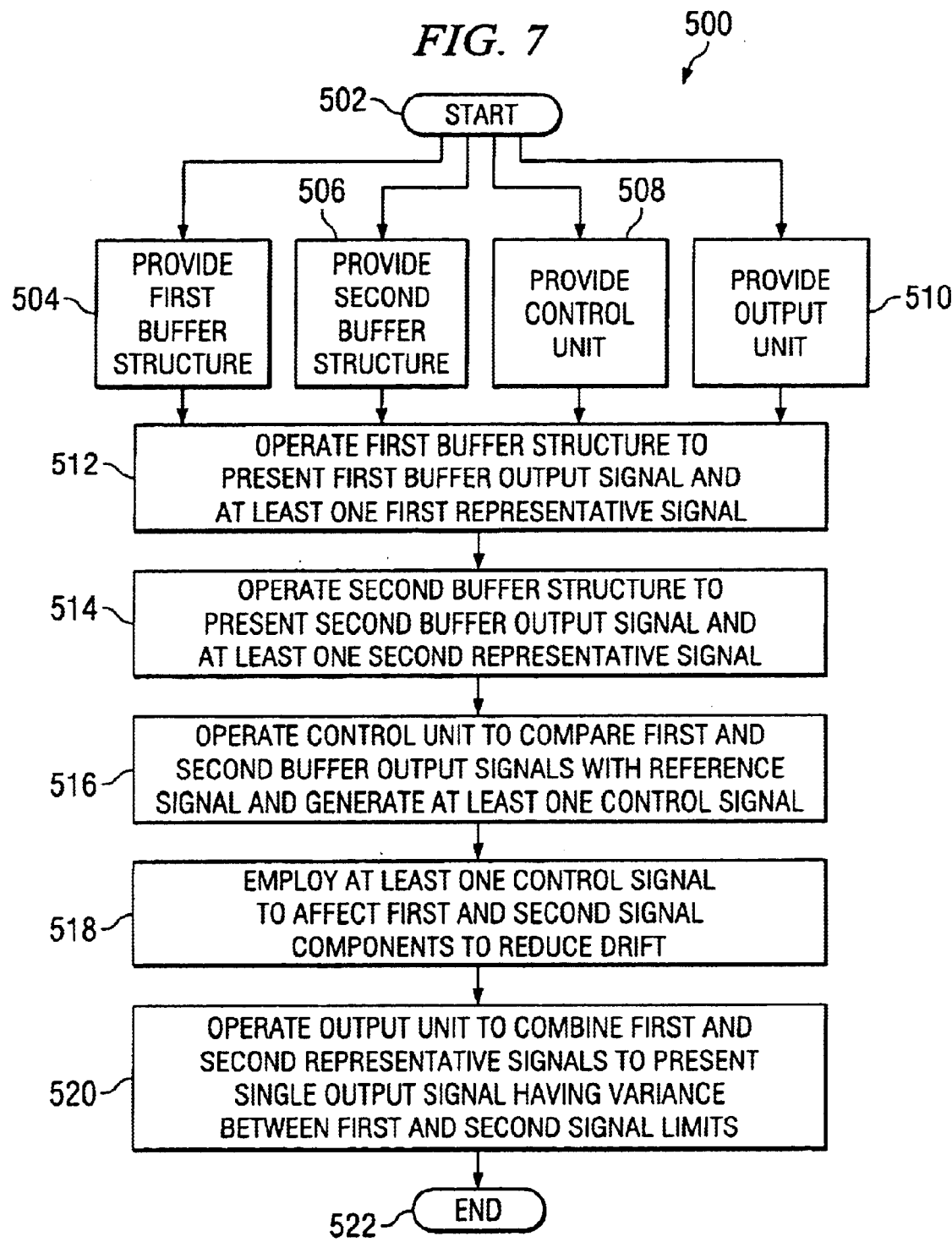

APPARATUS AND METHOD FOR CONVERTING A FULLY-DIFFERENTIAL CLASS-AB INPUT SIGNAL TO A RAIL-TO-RAIL SINGLE ENDED OUTPUT SIGNAL

CROSS REFERENCE TO RELATED APPLICATIONS

The present application is related to U.S. patent application Ser. No. 10/422,669 entitled "Common-Mode Current-Feedback Circuitry," filed Apr. 24, 2003, which is assigned to the current assignee hereof.

BACKGROUND OF THE INVENTION

The present invention is directed to signal conversion apparatuses, and especially to signal conversion apparatuses for converting fully-differential class-AB input signals to rail-to-rail single-ended output signals.

It is desirable that operational amplifiers for low supply voltages be able to utilize the largest portion of the supply voltage range possible, especially in terms of output signal, in order to improve the signal-to-noise ratio. In many arrangements base-emitter or gate-source voltages prevent the output signal from reaching within about 0.7 volts of the positive or negative supply voltage (i.e., the top or bottom rail). This limitation in output signal swing becomes a problem when the supply voltage is low, as is the case for example in battery powered systems or other low power applications.

Two-stage gain amplifiers have been used to provide rail-to-rail operation of output devices. Such an arrangement offers good linearity for larger output swings, but requires Miller compensation in the form of a feedback capacitor between the output and input of the single-ended signal output device. Miller capacitance is usually on the order of several picofarads and effects pole splitting to contribute to stable operation of the circuit. The value of the Miller compensation capacitance may be reduced by including a resistor in series (or a MOSFET in triode operation) with the Miller capacitance. Such an additional resistor has the effect of moving the right semi-plane zero to the left side of the origin in a pole plot and speeds up the operation of the apparatus. However, the value of the resistor must often be the inverse of output transistor's transconductance and may therefore not be practical in some applications where the amplifier is driving heavy loads.

The single-ended signal output device may be speeded up by employing a faster input, such as by employing a Class AB input device. A Class AB amplifier, for example, maintains current flow at all times so that an output device used with the Class AB amplifier can begin operation nearly instantly without lags that are present when operating with other types of amplifiers. Prior art employment of a Class AB input stage to a single-ended signal output device has typically used only one of the outputs presented by the Class AB input stage. That is, while the Class AB amplifier, or input stage, is known to provide a faster input section for any output stage, its speed (or slew rate) improvement is still limited because the input has to charge or discharge the Miller capacitance seen by the high impedance input node to the output stage.

There is a need for an apparatus and method for converting a fully-differential input signal varying between a top rail and a bottom rail that can produce a rail-to-rail single-ended output signal representative of the differential input signal.

SUMMARY OF THE INVENTION

An apparatus for converting a fully-differential input signal to an output signal which varies between two rail limits includes: (a) a first buffer receiving one component at a first input, presenting a first buffer output signal at a first buffer output and generating a first representative signal; (b) a second buffer receiving the other component at a second input, presenting a second buffer output signal at a second buffer output and generating a second representative signal; (c) a control unit coupled with at least one of the buffer outputs and comparing the buffer output signals with a reference signal to generate at least one control signal for reducing drift in the first and second components; and (d) an output unit coupled for combining the representative signals from the buffers to present the single output signal with rail-to-rail variance at an output locus.

A method for converting a differential input signal including a first signal component and a second signal component to a single output signal includes the steps of:

(a) in no particular order: (1) providing a first buffer structure for receiving the first signal component at a first input locus; (2) providing a second buffer structure receiving the second signal component at a second input locus; (3) providing a control unit coupled with the first buffer and the second buffer; and (4) providing an output unit coupled with the first buffer structure and with the second buffer structure; (b) operating the first buffer structure to present a first buffer output signal representative of the first signal component at a first buffer output locus, and to generate at least one first representative signal related to the first signal component; (c) operating the second buffer structure to present a second buffer output signal representative of the second signal component at a second buffer output locus, and to generate at least one second representative signal related to the second signal component; (d) operating the control unit to compare the first buffer output signal and the second buffer output signal with a reference signal to generate at least one control signal; (e) employing the at least one control signal to affect the first signal component and the second signal component to reduce drift of the first signal component and the second signal component; and (f) operating the output unit to combine the at least one first representative signal and the at least one second representative signal to present the single output signal at a signal output locus; the single output signal being related to a sum of the at least one first representative signal and the at least one second representative signal; the single output signal having a variance range limit substantially between the first signal limit and the second signal limit.

It is therefore an object of the present invention to provide an apparatus and method for converting a differential input signal to a rail-to-rail output signal.

It is a further object of the present invention to provide an apparatus and method for converting a fully-differential class-AB input signal to a rail-to-rail single-ended output signal representative of the differential input signal.

Further objects and features of the present invention will be apparent from the following specification and claims when considered in connection with the accompanying drawings, in which like elements are labeled using like reference numerals in the various figures, illustrating the preferred embodiments of the invention.

BRIEF DESCRIPTION OF THE DRAWINGS

FIG. 7 is a flow chart illustrating the method of the present invention.

DETAILED DESCRIPTION OF THE PREFERRED EMBODIMENT

Figure 1:
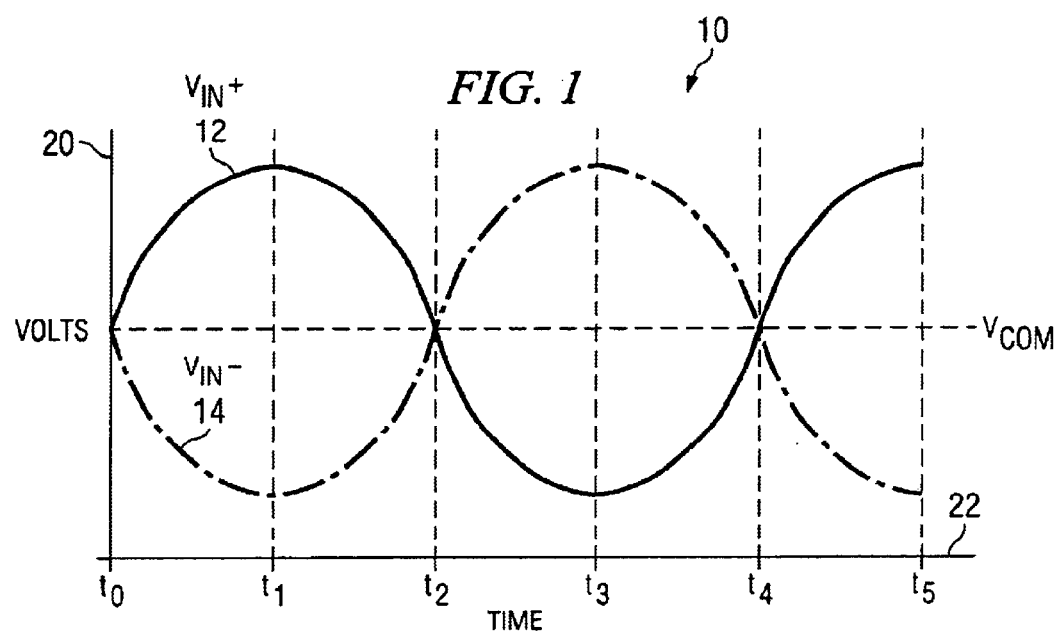
FIG. 1 is a graphic plot illustrating representative differential signals as a function of time.

FIG. 1 is a graphic plot illustrating representative differential signals as a function of time. In FIG. 1, a graphic plot 10 includes a first curve 12 and a second curve 14 plotted in volts, indicated on an axis 20, as a function of time, indicated on an axis 22. First curve 12 represents a first differential voltage component $V_{IN}+$. Second curve 14 represents a second differential voltage component $V_{IN}-$. First differential voltage component $V_{IN}+$ and second differential voltage component $V_{IN}+$ define a common voltage $V_{COM}$ at a value between first differential voltage component $V_{IN}+$ and second differential voltage component $V_{IN}-$. First differential voltage component $V_{IN}+$ and second differential voltage component $V_{IN}-$ are substantially 180° out of phase so that first differential voltage component $V_{IN}+$ and second differential voltage component $V_{IN}-$ are at voltage $V_{COM}$ substantially at times $t_0$, $t_2$, $t_4$. First differential voltage component $V_{IN}+$ is at a maximum value substantially at times $t_1$, $t_5$ and is at a minimum value substantially at time $t_3$. Second differential voltage component $V_{IN}-$ is at a minimum value substantially at times $t_1$, $t_5$ and is at a maximum value substantially at time $t_3$.

The symmetrical relation of first differential voltage component $V_{IN}+$ vis-à-vis second differential voltage component $V_{IN}-$ in substantially 180° out of phase orientation results in an effective input signal provided by first differential voltage component $V_{IN}+$ and second differential voltage component $V_{IN}-$ at a substantially constant voltage $V_{COM}$ (often referred to as the common mode voltage).

Figure 2:
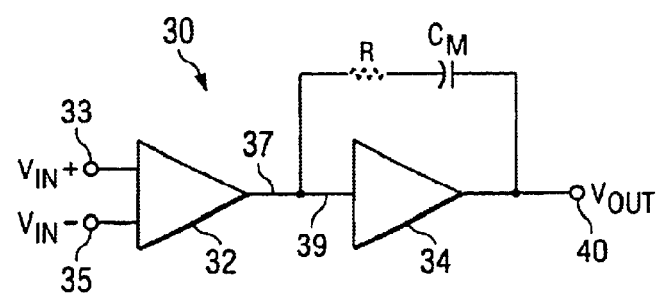
FIG. 2 is a simplified electrical schematic drawing of a representative prior art apparatus for generating a single-ended output signal representing a received differential signal.

FIG. 2 is a simplified electrical schematic drawing of a first representative prior art apparatus for generating a single-ended output signal representing a received differential signal. In FIG. 2, a signal-handling apparatus 30 includes a first stage amplifier device 32 and a second stage amplifier device 34. First stage amplifier device 32 receives a differential input signal; first stage amplifier device 32 receives a first differential input signal component $V_{IN}+$ at an input locus 33 and receives a second differential input signal component $V_{IN}-$ at an input locus 35. First stage amplifier device 32 produces an output signal at an output locus 37. Second stage amplifier device 34 has an input locus 39 coupled with output locus 37 of first stage amplifier device 32. Second stage amplifier device 34 amplifies signals received at input locus 39 to produce an output signal $V_{OUT}$ at an output locus 40. Output signal VOUT is generally equal with effective input voltage $V_{COM}$ that is presented to first stage amplifier device 32 by differential signal input components $V_{IN}+$, $V_{IN}-$ at input loci 33, 35.

Such two-stage gain amplifier arrangements of the sort illustrated in FIG. 2 offer good linearity for larger output swings. However, in order to achieve pole splitting to contribute to stable operation of signal-handling apparatus 30, it is necessary to introduce Miller compensation in the form of a feedback capacitor CM between output locus 40 and input locus 39 of second stage amplifier device 34. Such Miller compensation is often on the order of several picofarads.

The value of the Miller compensation may be reduced by including a resistor, such as resistor R in FIG. 2. Resistor R is illustrated in dotted line format to indicate the elective nature of employing resistor R in signal-handling apparatus 30. Resistor R, when employed in signal-handling apparatus 30, has the effect of moving the right semi-plane zero to the left side of the origin in a pole plot ad speeds up operation of signal-handling apparatus 30. However, the value of resistor R often must be valued as the inverse of the transconductance of the output transistor of signal-handling apparatus 30 (not shown in detail in FIG. 2). Such a value for resistor R may not be practical in some applications where signal-handling apparatus 30 is employed as an amplifier driving heavy loads.

Figure 3:
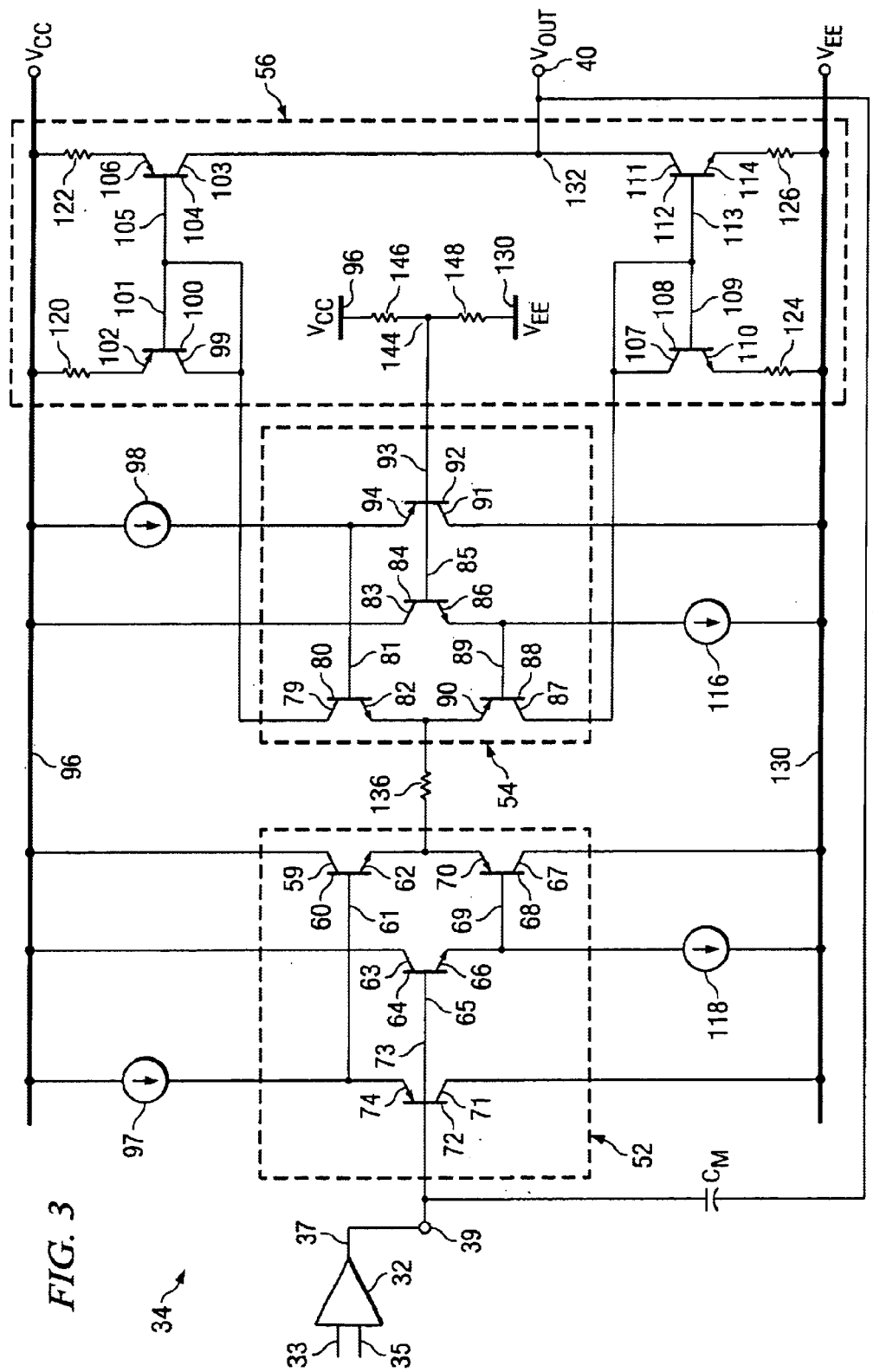
FIG. 3 is an electrical schematic diagram illustrating the representative prior art apparatus of FIG. 2 showing the second stage amplifier device in greater detail.

FIG. 3 is an electrical schematic diagram illustrating the representative prior art apparatus of FIG. 2 showing the second stage amplifier device in greater detail. In FIG. 3, a second stage amplifier device 34 receives an input signal at input locus 39 from output locus 37 of first stage amplifier device 32. Second stage amplifier device 34 includes a first buffer structure 52, a second buffer structure 54 and an output structure 56. Buffer structure 52 includes transistors 60, 64, 68, 72. Transistor 60 has a collector 59, a base 61 and an emitter 62. Transistor 64 has a collector 63, a base 65 and an emitter 66. Transistor 68 has a collector 67, a base 69 and an emitter 70. Transistor 72 has a collector 71, a base 73 and an emitter 74. Buffer structure 54 includes transistors 80, 84, 88, 92. Transistor 80 has a collector 79, a base 81 and an emitter 82. Transistor 84 has a collector 83, a base 85 and an emitter 86. Transistor 88 has a collector 87, a base 89 and an emitter 90. Transistor 92 has a collector 91, a base 93 and an emitter 94.

Output structure 56 includes transistors 100, 104, 108, 112 and resistors 120, 122, 124, 126. Transistor 100 has a collector 99, a base 101 and an emitter 102. Transistor 104 has a collector 103, a base 105 and an emitter 106. Transistor 108 has a collector 107, a base 109 and an emitter 110. Transistor 112 has a collector 111, a base 113 and an emitter 114. Resistor 120 is coupled with an upper supply voltage line 96 that provides a supply voltage $V_{DD}$ (the upper rail) and with emitter 102. Supply line 96 is also sometimes referred to as the upper rail. Resistor 122 is coupled with upper rail 96 and with emitter 106. Collector 99 is coupled with collector 79, with base 101 and with base 105; bases 101, 105 are connected. Thus, transistor 100 is diode connected. Resistor 124 is coupled with a lower supply voltage line 130 that provides a supply voltage $V_{EE}$ (the lower rail) and with emitter 110. Supply line 130 is also sometimes referred to as the lower rail. Resistor 126 is coupled with lower rail 130 and with emitter 114. Collector 107 is coupled with collector 87, with base 109 and with base 113; bases 109, 113 are connected. Thus, transistor 108 is diode connected. Collectors 103, 111 are coupled with an output locus 132.

Bases 85, 93 of transistors 84, 92 are coupled with a junction 144 to effect coupling with upper rail 96 via a resistor 146 and coupling with lower rail 130 via a resistor 148. Preferably resistors 146, 148 are equal in order that voltage applied at bases 85, 93 is substantially equal with common voltage $V_{COM}$ (FIG. 1).

Output locus 140 (FIG. 1) is coupled with collectors 103, 111 of transistors 104, 112 at a connection locus 132. A Miller capacitor CM is coupled in a feedback loop connecting output locus 140 wit input locus 39.

Lower rail 130 is coupled with base 89 and emitter 86 via a current source 116. Lower rail 130 is also coupled with collector 91, with collector 67, with collector 71 and with emitter 66 and base 69 via a current source 118. Upper supply rail 96 is connected with emitter 74 and base 61 via a current source 97. Upper rail 96 is also coupled with collector 63, with collector 59, with collector 83 and with emitter 94 and base 81 via a current source 98. A resistor 136 is coupled with emitters 62, 70 connected in common and is coupled with emitters 82, 90 connected in common.

Figure 4:
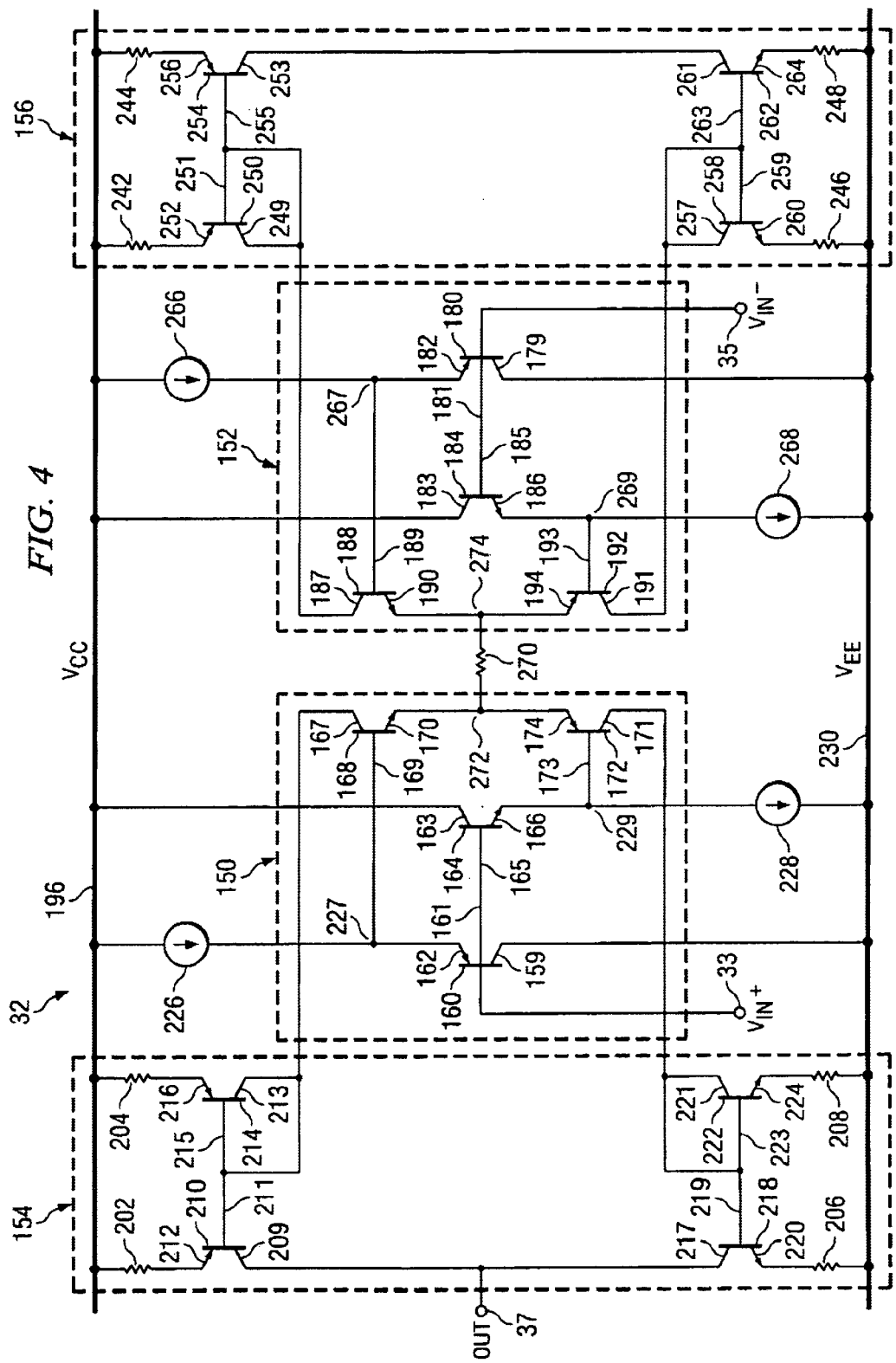
FIG. 4 is an electrical schematic diagram illustrating the first stage amplifier device of the representative prior art apparatus of FIG. 2 in greater detail.

FIG. 4 is an electrical schematic diagram illustrating the first stage amplifier device of the representative prior art apparatus of FIG. 2 in greater detail. In FIG. 4, first stage amplifier device 32 receives a duplex input signal having a first signal component $V_{IN}+$ received at an input locus 33 and having a second signal component $V_{IN}-$ received at an input locus 35.

First stage amplifier device 32 includes buffers 150, 152 and current mirrors 154, 156. Buffer 152 includes transistors 160, 164, 168, 172. Transistor 160 has a collector 159, a base 161 and an emitter 162. Transistor 164 has a collector 163, a base 165 and an emitter 166. Transistor 168 has a collector 167, a base 169 and an emitter 170. Transistor 172 has a collector 171, a base 173 and an emitter 174.

Buffer 152 includes transistors 180, 184, 188, 192. Transistor 180 has a collector 179, a base 181 and an emitter 182. Transistor 184 has a collector 183, a base 185 and an emitter 186. Transistor 188 has a collector 187, a base 199 and an emitter 190. Transistor 192 has a collector 191, a base 193 and an emitter 194.

Current mirror 154 includes resistors 202, 204, 206, 208 and transistors 210, 214, 218, 222. Transistor 210 has a collector 209, a base 211 and an emitter 212. Transistor 214 has a collector 213, a base 215 and an emitter 216. Transistor 218 has a collector 217, a base 219 and an emitter 220. Transistor 222 has a collector 221, a base 223 and an emitter 224. Resistor 202 is coupled between an upper supply voltage line 196 providing an upper supply voltage $V_{CC}$ (the upper rail) and emitter 212. Supply line 196 is also sometimes referred to as the upper rail. Resistor 204 is coupled between upper rail 196 and emitter 216. Resistor 206 is coupled between a lower supply voltage line 230 (the lower rail) providing an upper supply voltage $V_{EE}$ (the lower rail) and emitter 218. Supply line 230 is also sometimes referred to as the lower rail. Resistor 208 is coupled between lower rail 230 and emitter 224.

Collector 209 is coupled with collector 217. Collector 213 is coupled with collector 167. Collector 221 is coupled with collector 171. Output locus 37 is coupled with collectors 210, 217. Bases 211, 215 are coupled together and are coupled with collector 213 so that transistor 214 is diode-configured. Bases 219, 223 are coupled together and are coupled with collector 221 so that transistor 222 is diode-configured.

A current source 226 is coupled between upper rail 196 and a locus 227 that is common to base 169 and emitter 162. A current source 228 is coupled between lower rail 230 and a locus 229 that is common to base 173 and emitter 166. Bases 161, 165 are coupled with input locus 33.

Current mirror 156 includes resistors 242, 244, 246, 248 and transistors 250, 254, 258, 262. Transistor 250 has a collector 249, a base 251 and an emitter 252. Transistor 254 has a collector 253, a base 255 and an emitter 256. Transistor 258 has a collector 257, a base 259 and an emitter 260. Transistor 262 has a collector 261, a base 263 and an emitter 264. Resistor 242 is coupled between upper rail 196 and emitter 252. Resistor 244 is coupled between upper rail 196 and emitter 256. Resistor 246 is coupled between lower rail 230 and emitter 260. Resistor 248 is coupled between lower rail 230 and emitter 264. Collector 253 is coupled with collector 261. Collector 249 is coupled with collector 187. Collector 257 is coupled with collector 191. There is no output provided from collectors 210, 217 because first stage amplifier device provides only a single output signal (from output locus 37). Bases 251, 255 are coupled together and are coupled with collector 249 so that transistor 250 is diode-configured. Bases 259, 263 are coupled together and are coupled with collector 257 so that transistor 258 is diode-configured.

A current source 266 is coupled between upper rail 196 and a locus 267 that is common to base 189 and emitter 182. A current source 268 is coupled between lower rail 230 and a locus 269 that is common to base 193 and emitter 186. Bases 181, 185 are coupled with input locus 35.

A resistor 270 is coupled between a locus 270 (common to emitters 172, 174) and a locus 272 (common to emitters 186, 194).

The speed, or slew rate (SR) of a Rail-to-Rail amplifier of the sort illustrated in FIGS. 2, 3 and 4 is given by:

$$SR = \frac{I}{C_C} \quad [1]$$

where $C_C$ is Compensation Capacitance, given by $$C_C = A_S \cdot C_M \quad [2]$$

Where, $A_S$ is the voltage gain of the rail-to-rail output stage (second stage amplifier device 34), and $C_M$ is the value of the Miller compensation capacitor (FIG. 3).

$$I = \left(\frac{V_{IN+} - V_{IN-}}{R}\right) \quad [3]$$

$V_{IN}+$ and $V_{IN}-$ are the differential input voltage signals applied at input loci 33, 35 of first stage amplifier device 32 (FIG. 4). R is the resistance value of resistor 270 (first stage amplifier device 32; FIG. 4).

Combining Eqns [1] and [3]:

$$SR = \frac{I}{C_C} = \frac{1}{C_C}\left(\frac{V_{IN+} - V_{IN-}}{R}\right) \quad [4]$$

This illustrates that, even though one may employ a faster input stage (first stage amplifier device 32), such as a Class AB amplifier, significant limitations to operational speed of the rail-to-rail device are still present in the output stage (second stage amplifier device 34).

It would be advantageous to further increase speed of a rail-to-rail operational amplifier device beyond the currently experienced limitations of prior art apparatuses of the sort illustrated in FIGS. 2, 3 and 4.

The apparatus and method of the present invention achieves the desired faster speeds (slew rates) by using a fully-differential input signal to the second stage amplifier device. A control circuit is employed, preferably embodied in a current controlling common mode feedback (CMFB) circuit for affecting input currents to avoid drifting by the inputs. That is, input currents to the second stage amplifier apparatus are controlled to keep the common mode voltage of the second stage amplifier device (that is, the output stage) substantially constant. Several advantages are gained by using a fully differential input, including improved speed (slew rate), improved rejection of environmental noise and good linearity because of second harmonic cancellation.

Figure 5:
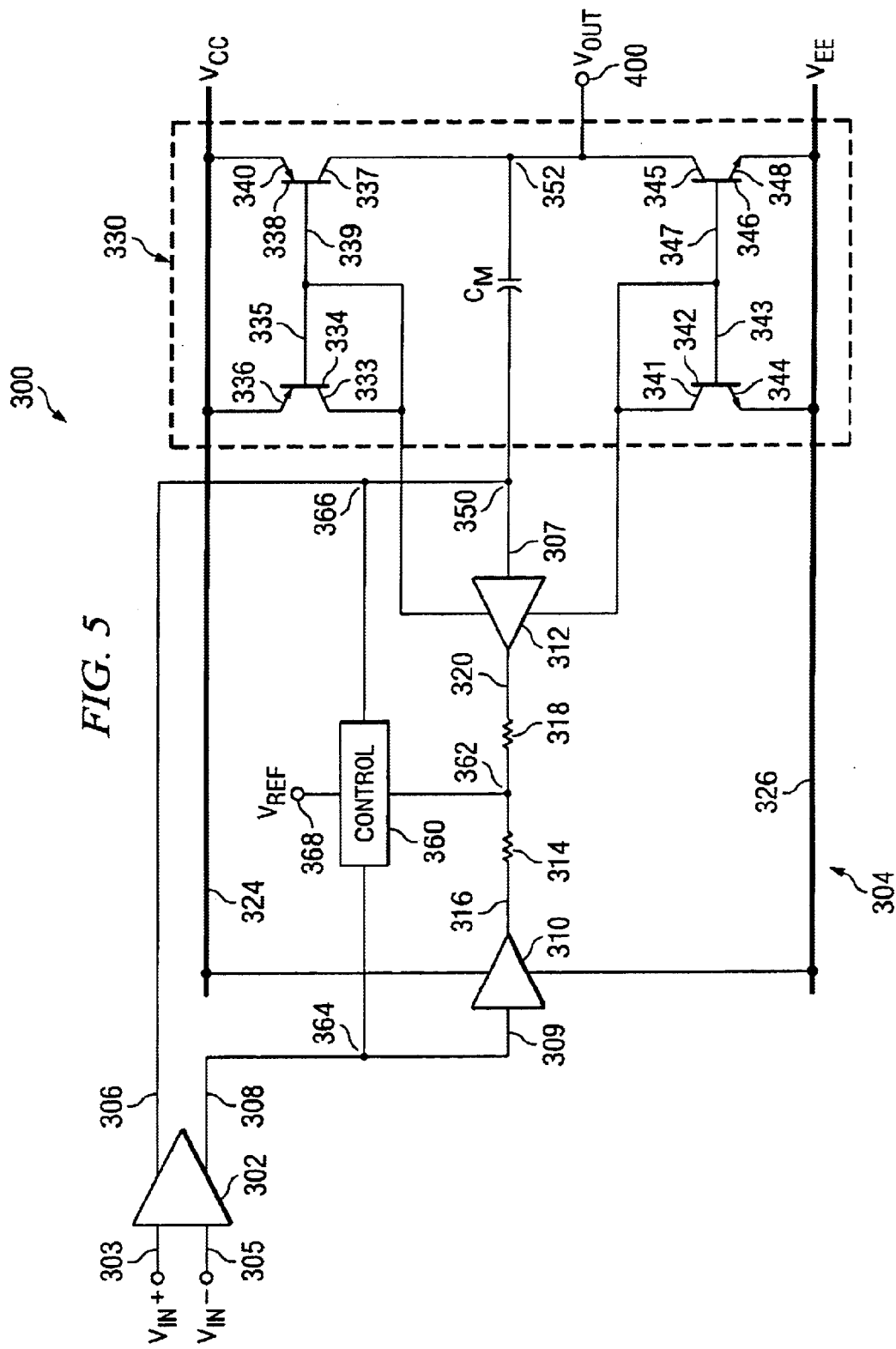
FIG. 5 is a simplified schematic diagram illustrating the preferred embodiment of the apparatus of the present invention.

FIG. 5 is a simplified schematic diagram illustrating the preferred embodiment of the apparatus of the present invention. In FIG. 5, a signal-handling apparatus 300 includes a first stage amplifier device 302 and a second stage amplifier device 304. First stage amplifier device 302 receives a differential input signal; first stage amplifier device 302 receives a first differential input signal component $V_{IN}+$ at an input locus 303 and receives a second differential input signal component $V_{IN}-$ at an input locus 30. First stage amplifier device 302 produces a fully-differential output signal at a first output locus 307 and a second output locus 308.

Second stage amplifier device 304 has a first input locus 307 coupled with first output locus 306 of first stage amplifier device 302, and a second input locus 309 coupled with second output locus 308 of first stage amplifier device 302. Second stage amplifier device 304 amplifies signals received at input loci 307, 309 to produce an output signal $V_{OUT}$ at an output locus 400. Output signal $V_{OUT}$ is generally equal with effective input voltage $V_{COM}$ (FIG. 1) that is established from first stage amplifier device 302 by fully-differential input signals from output loci 306, 308.

Second stage amplifier device 204 includes a first buffer 310 coupled with input locus 309 and a second buffer 312 coupled with input locus 307. First buffer 310 presents a first buffer output voltage to an output resistor 314 via a first buffer voltage output locus 316. Second buffer 312 presents a second buffer output voltage to an output resistor 318 via a second buffer voltage output locus 320. First buffer 310 is coupled with an upper supply voltage line 324 (the upper rail) providing an upper supply voltage $V_{CC}$ and is coupled with a lower supply voltage line 326 (the lower rail) that provides a supply voltage $V_{EE}$. Second buffer 312 is coupled with upper rail 324 via a current mirror and is coupled with lower rail 326 via current mirror 330.

Current mirror 330 includes transistors 334, 338, 342, 346. Transistor 334 has a collector 333, a base 335 and an emitter 336. Transistor 338 has a collector 337, a base 339 and an emitter 340. Transistor 342 has a collector 341, a base 343 and an emitter 344. Transistor 346 has a collector 345, a base 347 and an emitter 348. Upper rail 324 is coupled with emitters 336, 338. Lower rail 326 is coupled with collectors 344, 348.

A Miller compensation capacitor $C_M$ is coupled between a locus 350 (in common with input locus 307 and input line 306) and a locus (in common with collectors 337, 345). Output locus 400 is coupled in common with collectors 337, 345.

A control unit 360 is coupled with a locus 362 between and in common with resistors 314, 318. Control unit 360 is thereby connected to sense the common mode voltage ($V_{COM}$; FIG. 1) presented by buffers 310, 312 in response to fully-differential input signals received at input loci 307, 309 from first stage amplifier device 302. Control unit 360 compares the sensed common mode voltage $V_{COM}$ with a reference signal $V_{REF}$ received from a reference signal source 368 to generate feedback control signals for application to loci 364, 366 at input signal lines from loci 306, 308. First stage amplifier device 302 may be configured, for example, substantially like first stage amplifier device 32 (FIG. 4) with an additional output signal produced from a locus in common with collectors 253, 261 (FIG. 4) to present the fully-differential signals required by the present invention at output loci 306, 308 (FIG. 5). When first stage amplifier device 302 is so configured, output loci 306, 308 are coupled with a current mirror (156, FIG. 4) so that output signals presented at output loci 306, 308 are current signals. Accordingly, control unit 360 is preferably configured to effect feedback control of current signals appropriate to establish a common mode voltage $V_{COM}$ at locus 362. Feedback control of current signals received from an input unit (e.g., first stage amplifier device 302) to effect control of a common mode voltage level in an output unit (e.g., second stage amplifier device 304) is an important aspect of the present invention, Employment of a fully-differential signal as an input to an output unit is another important aspect of the present invention. As a result of employing these two important aspects of the present invention, while Miller compensation (capacitor $C_M$, FIG. 5) is still necessary, higher speeds are attainable in rail-to-rail output operations because the fully-differential input signals provide greater current. Thus, as indicated by Eqn [4] (reproduced below), higher slew rates SR (i.e., speed) may be achieved.

$$SR = \frac{I}{C_C} = \frac{1}{C_C}\left(\frac{V_{IN+} - V_{IN-}}{R}\right) \quad [4]$$

Figure 6:
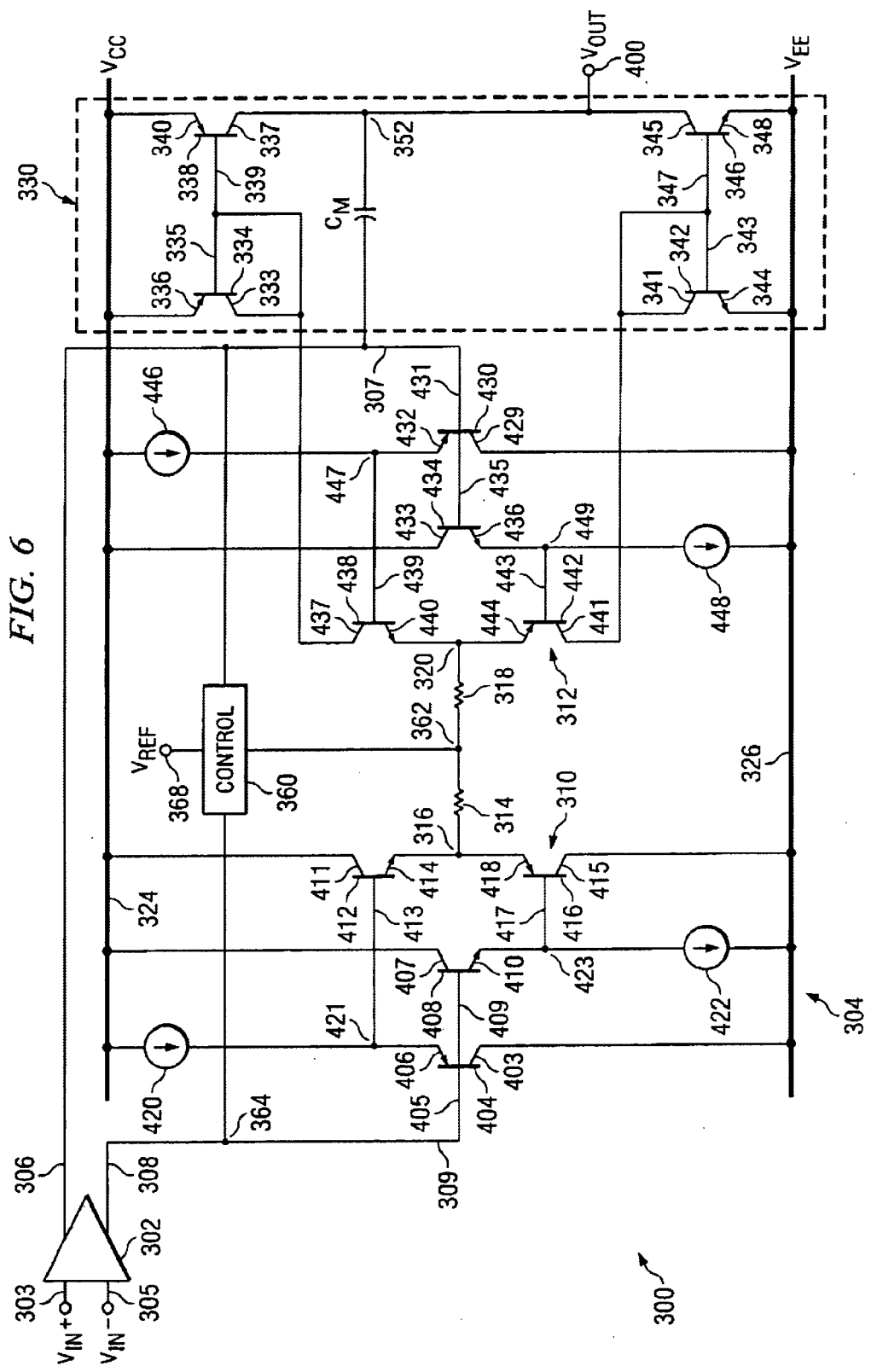
FIG. 6 is an electrical schematic diagram illustrating details of the preferred embodiment of the apparatus of the present invention.

FIG. 6 is an electrical schematic diagram illustrating details of the preferred embodiment of the apparatus of the present invention. In FIG. 6, substantially all components remain the same as they are illustrated and described in FIG. 5. Details relating to buffers 310, 312 are added in FIG. 6 and, in the interest of avoiding prolixity, only those added details will be described hereinafter.

Buffer 310 includes transistors 404, 408, 412, 416 and current sources 420, 422. Transistor 404 has a collector 403, a base 405 and an emitter 406. Transistor 408 has a collector 407, a base 409 and an emitter 410. Input locus 309 is coupled with bases 405, 409. Transistor 412 has a collector 411, a base 413 and an emitter 414. Transistor 416 has a collector 415, a base 417 and an emitter 418. Current source 420 is coupled between upper rail 324 and a locus 421 in common with emitter 406 and base 413. Current source 422 is coupled between lower rail 326 and a locus 423 in common with emitter 410 and base 417. Upper rail 324 is coupled with collectors 407, 411. Lower rail is coupled with collectors 413, 415. First buffer voltage output locus 316 is coupled in common with emitters 414, 418.

Buffer 312 includes transistors 430, 434, 438, 442 and current sources 446, 448. Transistor 430 has a collector 429, a base 431 and an emitter 432. Transistor 434 has a collector 433, a base 435 and an emitter 436. Input locus 307 is coupled with bases 431, 435. Transistor 438 has a collector 437, a base 439 and an emitter 440. Transistor 442 has a collector 441, a base 443 and an emitter 444. Current source 446 is coupled between upper rail 324 and a locus 447 in common with emitter 432 and base 439. Current source 448 is coupled between lower rail 326 and a locus 449 in common with emitter 436 and base 443. Upper rail 324 is coupled with collector 433. Lower rail is coupled with collector 429. Second buffer voltage output locus 320 is coupled in common with emitters 440, 444.

FIG. 7 is a flow chart illustrating the method of the present invention. In FIG. 7, a method 500 for converting a differential input signal to a single output signal begins at a START locus 502. The differential input signal includes a first signal component and a second signal component. Method 500 continues with the step of, in no particular order: (1) providing a first buffer structure for receiving the first signal component at a first input locus, as indicated by a block 504; (2) providing a second buffer structure receiving the second signal component at a second input locus, as indicated by a block 506; (3) providing a control unit coupled with the first buffer and the second buffer, as indicated by a block 508; and (4) providing an output unit coupled with the first buffer structure and with the second buffer structure as indicated by a block 510.

Method 500 continues with the step of operating the first buffer structure to present a first buffer output signal representative of the first signal component at a first buffer output locus, and to generate at least one first representative signal related to the first signal component, as indicated by a block 512.

Method 500 continues with the step of operating the second buffer structure to present a second buffer output signal representative of the second signal component at a second buffer output locus, and to generate at least one second representative signal related to the second signal component, as indicated by a block 514.

Method 500 continues with the step of operating the control unit to compare the first buffer output signal and the second buffer output signal with a reference signal to generate at least one control signal as indicated by a block 516.

Method 500 continues with the step of employing the at least one control signal to affect the first signal component and the second signal component to reduce drift of the first signal component and the second signal component as indicated by a block 518.

Method 500 continues with the step of operating the output unit to combine the at least one first representative signal and the at least one second representative signal to present the single output signal at a signal output locus; the single output signal being related to a sum of the at least one first representative signal and the at least one second representative signal; the single output signal having a variance range limit substantially between the first signal limit and the second signal limit, as indicated by a block 520. Method 500 terminates at an END locus 522.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims.

We claim:

1. An apparatus for converting a differential input signal to a single output signal; said differential input signal including a first signal component and a second signal component; the apparatus comprising:
   (a) a first buffer structure receiving said first signal component at a first input locus; said first buffer structure presenting a first buffer output signal representative of said first signal component at a first buffer output locus; said first buffer structure generating at least one first representative signal related to said first signal component;
   (b) a second buffer structure receiving said second signal component at a second input locus; said second buffer structure presenting a second buffer output signal representative of said second signal component at a second buffer output locus; said second buffer structure generating at least one second representative signal related to said second signal component;
   (c) a control unit coupled with at least one buffer output locus of said first buffer output locus and said second buffer output locus; said control unit comparing said at least one buffer output signal with a reference signal to generate at least one control signal; said at least one control signal affecting at least one signal component of said first signal component and said second signal component to reduce drift of said at least one signal component; and
   (d) an output unit coupled for receiving said at least one first representative signal from said first buffer structure and for receiving said at least one second representative signal from said second buffer structure; said output unit combining said at least one first representative signal and said at least one second representative signal to present said single output signal at a signal output locus; said single output signal being related to a sum of said first representative signal and said second representative signal; said single output signal having a variance range limit substantially between said first signal limit and said second signal limit.

2. An apparatus for converting a differential input signal to a single output signal as recited in claim 1 wherein said first buffer output locus and said second buffer output locus are connected electrically in common.

3. An apparatus for converting a differential input signal to a single output signal as recited in claim 2 wherein said at least one buffer output signal is said first buffer output signal and said second buffer output signal, and wherein said control unit compares said first buffer output signal and said second buffer output signal with said reference signal.

4. An apparatus for converting a differential input signal to a single output signal as recited in claim 1 wherein said at least one first representative signal is at least one first current, said at least one second representative signal is at least one second current and said output unit is embodied in a current mirror.

5. An apparatus for converting a differential input signal to a single output signal as recited in claim 2 wherein said at least one first representative signal is at least one first current, said at least one second representative signal is at least one second current and said output unit is embodied in a current mirror.

6. An apparatus for converting a differential input signal to a single output signal as recited in claim 3 wherein said at least one first representative signal is at least one first current, said at least one second representative signal is at least one second current and said output unit is embodied in a current mirror.

7. An apparatus for receiving a fully differential input signal and presenting a single-ended output signal representative of said differential input signal; said differential input signal including a plurality of input signal components; the apparatus comprising:
   (a) a plurality of input units; each respective input unit of said plurality of input units receiving at least one said respective input signal component of said plurality of input signal components from a respective input signal line of a plurality of input signal lines;
   (b) a feedback unit coupled with selected input signal lines of said plurality of input signal lines and coupled with said plurality of input units for receiving a respective treated output signal from each said respective input unit; said feedback unit comparing each said respective treated output signal with a reference signal; said feedback unit generating a respective feedback signal from each said comparing; each said respective feedback signal affecting a respective selected said input signal component to reduce drift of said respective selected input signal component; and (c) a combining unit; said combining unit being coupled with at least one first selected input unit of said plurality of input units for receiving at least one first representative signal from said at least one first selected input unit; said combining unit being coupled with at least one second selected input unit of said plurality of input units for receiving at least one second representative signal from said at least one second selected input unit; said combining unit generating said single-ended output signal at an output locus; said single-ended output signal being related to said at least one first representative signal from each of said at least one first selected input units and said at least one second representative signal from each of said at least one second selected input units.

8. An apparatus for receiving a fully differential input signal and presenting a single-ended output signal representative of said differential input signal as recited in claim 7 wherein said selected input signal lines comprise each said respective input signal line.

9. An apparatus for receiving a fully differential input signal and presenting a single-ended output signal representative of said differential input signal as recited in claim 7 wherein said plurality of input units comprises a first buffer unit and a second buffer unit, wherein said at least one first selected input unit is said first buffer unit and wherein said at least one second selected input unit is said second buffer unit.

10. An apparatus for receiving a fully differential input signal and presenting a single-ended output signal representative of said differential input signal as recited in claim 7 wherein said at least one first representative signal is at least one first current, said at least one second representative signal is at least one second current and said output unit is embodied in a current mirror.

11. An apparatus for receiving a fully differential input signal and presenting a single-ended output signal representative of said differential input signal as recited in claim 8 wherein said plurality of input units comprises a first buffer unit and a second buffer unit, wherein said at least one first selected input unit is said first buffer unit and wherein said at least one second selected input unit is said second buffer unit.

12. An apparatus for receiving a fully differential input signal and presenting a single-ended output signal representative of said differential input signal as recited in claim 8 wherein said at least one first representative signal is at least one first current, said at least one second representative signal is at least one second current and said output unit is embodied in a current mirror.

13. An apparatus for receiving a fully differential input signal and presenting a single-ended output signal representative of said differential input signal as recited in claim 9 wherein said at least one first representative signal is at least one first current, said at least one second representative signal is at least one second current and said output unit is embodied in a current mirror.

14. A method for converting a differential input signal to a single output signal; said differential input signal including a first signal component and a second signal component; the method comprising the steps of:

(a) in no particular order:
  (1) providing a first buffer structure for receiving said first signal component at a first input locus;
  (2) providing a second buffer structure receiving said second signal component at a second input locus;
  (3) providing a control unit coupled with said first buffer and said second buffer; and
  (4) providing an output unit coupled with said first buffer structure and with said second buffer structure;

(b) operating said first buffer structure to present a first buffer output signal representative of said first signal component at a first buffer output locus, and to generate at least one first representative signal related to said first signal component;

(c) operating said second buffer structure to present a second buffer output signal representative of said second signal component at a second buffer output locus, and to generate at least one second representative signal related to said second signal component;

(d) operating said control unit to compare said first buffer output signal and said second buffer output signal with a reference signal to generate at least one control signal;

(e) employing said at least one control signal to affect said first signal component and said second signal component to reduce drift of said first signal component and said second signal component; and (f) operating said output unit to combine said at least one first representative signal and said at least one second representative signal to present said single output signal at a signal output locus; said single output signal being related to a sum of said at least one first representative signal and said at least one second representative signal; said single output signal having a variance range limit substantially between said first signal limit and said second signal limit.

15. A method for converting a differential input signal to a single output signal as recited in claim 14 wherein said at least one first representative signal is at least one first current, said at least one second representative signal is at least one second current and said output unit is embodied in a current mirror.

* * * * *